United States Patent
Dong et al.

(10) Patent No.: US 8,384,226 B2
(45) Date of Patent: Feb. 26, 2013

(54) HYBRID BUMP CAPACITOR

(75) Inventors: Yikui (Jen) Dong, Cupertino, CA (US); Steven L. Howard, Fort Collins, CO (US); Freeman Y. Zhong, San Ramon, CA (US); David S. Lowrie, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 205 days.

(21) Appl. No.: 12/885,722

(22) Filed: Sep. 20, 2010

(65) Prior Publication Data

US 2011/0006395 A1      Jan. 13, 2011

Related U.S. Application Data

(63) Continuation of application No. 11/741,195, filed on Apr. 27, 2007, now Pat. No. 7,825,522.

(60) Provisional application No. 60/831,892, filed on Jul. 18, 2006.

(51) Int. Cl.
*H01L 23/48* (2006.01)
*H01L 27/108* (2006.01)
*H01L 21/00* (2006.01)

(52) U.S. Cl. ........ 257/778; 257/306; 257/738; 438/399; 438/666

(58) Field of Classification Search ............ 257/306, 257/307, 738, 778, E21.016, E21.397, E27.071; 438/396, 399, 666
See application file for complete search history.

(56) References Cited

U.S. PATENT DOCUMENTS

| | | | | |
|---|---|---|---|---|
| 7,557,440 | B2* | 7/2009 | Yamamoto et al. | 257/700 |
| 2003/0049885 | A1* | 3/2003 | Iijima et al. | 438/106 |
| 2004/0140553 | A1* | 7/2004 | Naito et al. | 257/700 |
| 2006/0203421 | A1 | 9/2006 | Morris et al. | 361/277 |

* cited by examiner

*Primary Examiner* — Hung Vu
(74) *Attorney, Agent, or Firm* — Christopher P. Maiorana, PC

(57) ABSTRACT

A device fabricated on a chip is disclosed. The device generally includes (A) a first pattern and a second pattern both created in an intermediate conductive layer of the chip, (B) at least one via created in an insulating layer above the intermediate conductive layer and (C) a first bump created in a top conductive layer above the insulating layer. The first pattern generally establishes a first of a plurality of plates of a first capacitor. The via may be aligned with the second pattern. The first bump may (i) be located directly above the first plate, (ii) establish a second of the plates of the first capacitor, (iii) be suitable for flip-chip bonding, (iv) connect to the second pattern through the via such that both of the plates of the first capacitor are accessible in the intermediate conductive layer. The first pattern and the second pattern may be shaped as interlocking combs.

17 Claims, 9 Drawing Sheets

'NO FLY ZONE': REFRAIN FROM PUTTING CIRCUITRY UNDER THE BUMP TO MINIMIZE THE PARASITIC CAPS

HYBRID BUMP CAPACITOR

This is a continuation of U.S. Ser. No. 11/741,195, filed Apr. 27, 2007 now U.S. Pat. No. 7,825,522, which is incorporated by reference.

This application claims the benefit of U.S. Provisional Application No. 60/831,892, filed Jul. 18, 2006, which is hereby incorporated by reference in its entirety.

FIELD OF THE INVENTION

The present invention relates to data transmission interfaces generally and, more particularly to a hybrid bump capacitor.

BACKGROUND OF THE INVENTION

High-speed SERDES (Serial/Deserial) technology has been under active development over the last 20 years. SERDES technology has been widely used in data storage systems, telecommunications, computer technologies and many other fields. A desire for higher transmission bandwidths and speeds through SERDES devices never stops. Ten years ago, designers struggled with designs reaching single lane transmission of 2 Gbps (gigabits per second) in CMOS technology. Presently, specifications for SERDES devices have passed 10 Gbps.

In a high-speed transceiver design, AC coupling in a channel between a transmitter connection and a receiver connection is preferred, and is often specified for proper functioning of the link. In DC coupled links, the signal is sensitive to duty cycle distortion due to the common-mode voltage mismatch between the transmitter and the receiver. At high transmission frequencies of 6 Gbps and beyond, where the signal loss is significant through the backplane, the signal damage resulting from the duty cycle distortion is permanent and is problematic for the receiver to recover.

Referring to FIG. 1, a perspective diagram of a conventional on-chip AC-coupled high speed circuit 80 is shown. The circuit 80 has a bump 82 connected to an AC capacitor 84 through a metal routing line 86, that presents a parasitic resistance (i.e., R_RTG) and a parasitic capacitance (i.e., C_RTG), all fabricated on a substrate 88. Additional circuitry 87 is commonly fabricated below the bump 82. A power/ground plane 90 commonly exists above the capacitor 84. The structure of the circuit 80 results in parasitic capacitances to the power/ground planes 88 and 90 as represented by (i) CP_BUMP (ii) C_RTG, (iii) CP1_P1, (iv) CP2_P1, (v) CP1_P2 and (vi) CP2_P2, as shown.

The capacitor 84 occupies a large silicon footprint. In many cases, the capacitor 84 dominates the total silicon budget. Furthermore, the bump 82 and the capacitor 84 contribute significant individual parasitic capacitances (often the top two dominating parasitic capacitances), weakening the overall high-speed performance of the circuit 80. Commonly, the line 86 may route hundreds of microns from the bump 82 to the capacitor 84 due to priority placement of various blocks relative to the bump 82. The long line 86 contributes to signal degradation that also limit the performance the circuit 80. Still further, the capacitor 84 is usually fabricated in the lower metal and polysilicon layers thereby creating routing channel congestion.

SUMMARY OF THE INVENTION

The present invention concerns a device fabricated on a chip. The device generally comprises (A) a first pattern and a second pattern both created in an intermediate conductive layer of the chip, (B) at least one via created in an insulating layer above the intermediate conductive layer and (C) a first bump created in a top conductive layer above the insulating layer. The first pattern generally establishes a first of a plurality of plates of a first capacitor. The via may be aligned with the second pattern. The first bump may (i) be located directly above the first plate, (ii) establish a second of the plates of the first capacitor, (iii) be suitable for flip-chip bonding and (iv) connect to the second pattern through the via such that both of the plates of the first capacitor are accessible in the intermediate conductive layer.

The objects, features and advantages of the present invention include providing a hybrid bump capacitor that may (i) occupy a relatively small layout footprint compared with conventional designs, (ii) have less than half the parasitic capacitances of conventional designs, (iii) achieve both a solder bump and an AC coupling capacitor function simultaneously, (iv) eliminate problematic high speed signal routing from the bump to the capacitor, (v) clear crossover routing congestion commonly found in lower conductive layers and/or (vi) shorten a path from the bump to an active circuit and/or a passive circuit.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention generally concerns a hybrid device that combines a solder bump and an AC coupling capacitor. The hybrid device may be suitable for both (i) bump/pad inter-chip interfaces and (ii) on-chip AC coupling functions for high speed input pins and output pins. A structure of the hybrid device is generally formed using a few (e.g., two or more) highest layer metals of the chip. Lower layer metals and polysilicon layers of the chip may be untouched by the hybrid device structure. The combination of the solder bump and the capacitor into a single device generally reduces combined parasitic capacitances and a layout footprint compared with techniques forming a separate bump and a separate capacitor. The hybrid device may be particularly suitable in an environment of large scale mixed signal integrated circuit implementations in modern deep submicron CMOS technology where multiple layer metal options are usually available.

Figure 2:
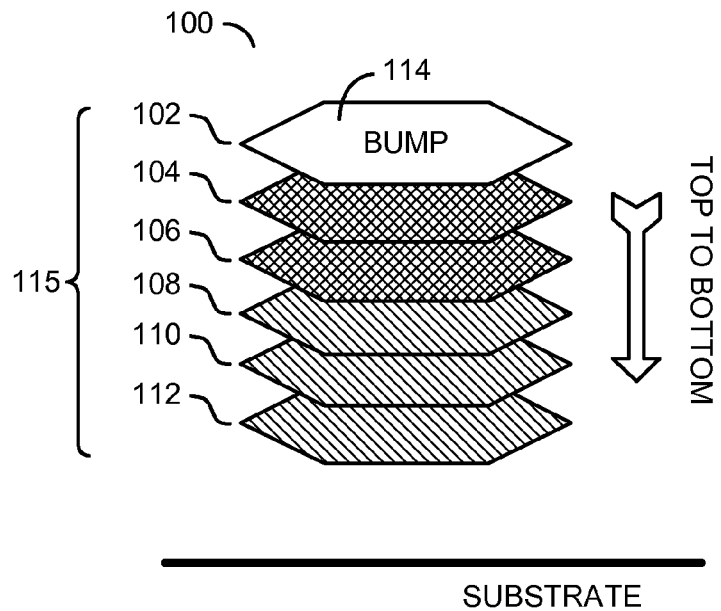
FIG. 2 is a block diagram of a first example implementation of a device is shown in accordance with a preferred embodiment of the present invention.

Referring to FIG. 2, a block diagram of a first example implementation of a device 100 is shown in accordance with a preferred embodiment of the present invention. The device (or module) 100 may be referred to as a hybrid device. The device 100 generally comprises a top conductive layer 102 and one or more intermediate conductive layers 104-112. Each of the layers 102-112 generally comprises a respective metal layer patterned to form the device 100. The layer 102 generally comprises a solder bump (or a wire bond pad) 114. The layers 104-112 generally comprise some, but not all of the metal layers (e.g., metal layers 4-9) of the chip. Inter-layer connection (see FIG. 3) may connect the various layers 102-112 where appropriate to increase the capacity of the resulting capacitor 115.

A top plate of the AC coupling capacitor 115 may be established by the bump 114. The other plate of the capacitor 115 may be established by one or more of the layers 104-112. Each of the layers 104-112 may establish either a single plate of the capacitor 115 or portions of both plates. The bump 114 and the capacitor 115 generally form a unified entity reaching down from the layer 102. The inter-layer connections generally allow access to both plates of the capacitor 115 from the bottom layer of the device 100.

A length, a width and a shape of the device 100 may be determined by a size of the bump 114 specified for the layer 102. The bump 114 may be created in the same layer, with the same size and shape as other common bumps. The layers 104-112 generally resides directly under the bump 114. A number of the layers 104-112 used to implement the capacitor 115 may be determined by a minimum AC coupling criteria.

The vertical structure of the device 100 generally results in a large coupling capacitance to parasitic capacitance ratio that may be beneficial in high speed circuit designs. The integrated structure of the device 100 generally eliminates potentially problematic high speed signal routes from the bump 114 to the capacitor 115. Potential routing path congestion under the capacitor 115 may be alleviated because the lower conductive layers (e.g., metal layers 1, 2 and/or 3) are generally not used in creating the capacitor 115 and thus may be available for routing. Furthermore, by spreading the routes apart from each other and away from the capacitor plates, the overall cross-coupling to the bump 114 may be reduced.

Figure 3:
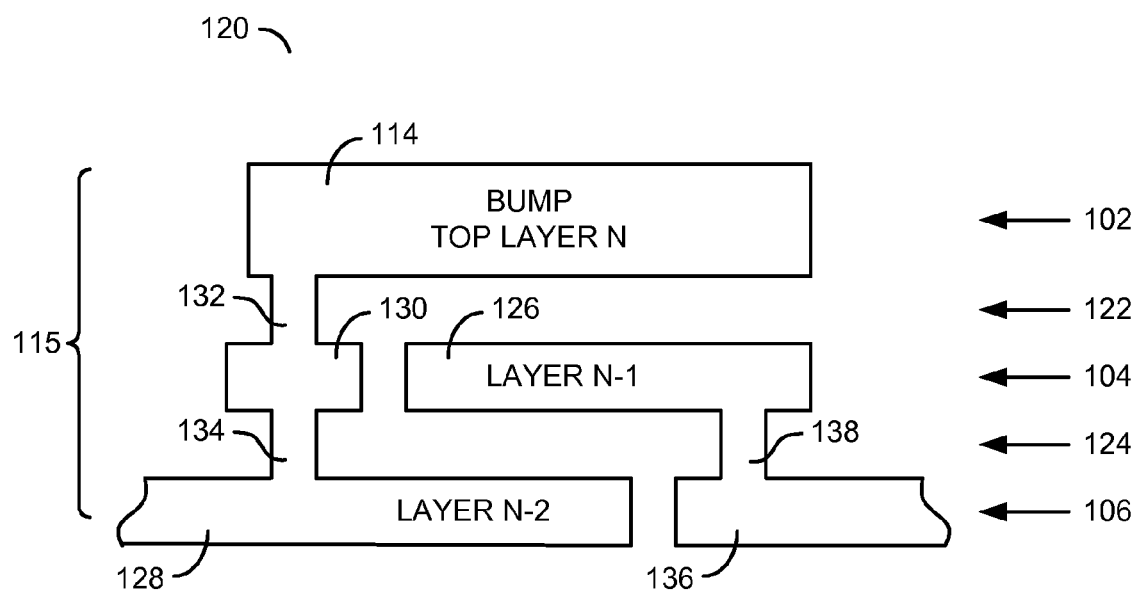
FIG. 3 is a perspective view of a second example implementation of the device.

Referring to FIG. 3, a perspective view of a second example implementation of a device 120 is shown. The device (or module) 120 may be a variation of the device 100. The device 120 generally comprises the bump 114 in the layer 102, the layer 104, the layer 106, an insulating layer 122 and an insulating layer 124.

A pattern (or region) 126 created in the layer 104 may form a first plate of the capacitor 115 of the device 120. The bump 114 may form a portion of a second plate of the capacitor 115. Another pattern (or region) 128 created in the layer 106 may form another portion of the second plate. The pattern 128 may be connected to the bump 114 by way of a pattern (or region) 130 created in the layer 104 and inter-layer contacts 132 and 134 through vias in the layers 122 and 124, respectively. An additional pattern (or region) 136 may be created in the layer 106 and connected to the pattern 126 with an inter-layer contact 138. The pattern 130 generally allows both plates of the capacitor 115 to be accessed in the layer 104. The pattern 136 generally allows both plates of the capacitor 115 to be reached in the layer 106. The capacitance may be increased by creating additional plate segments on the lower layers 108-112 to meet the criteria of a particular application.

Figure 4:
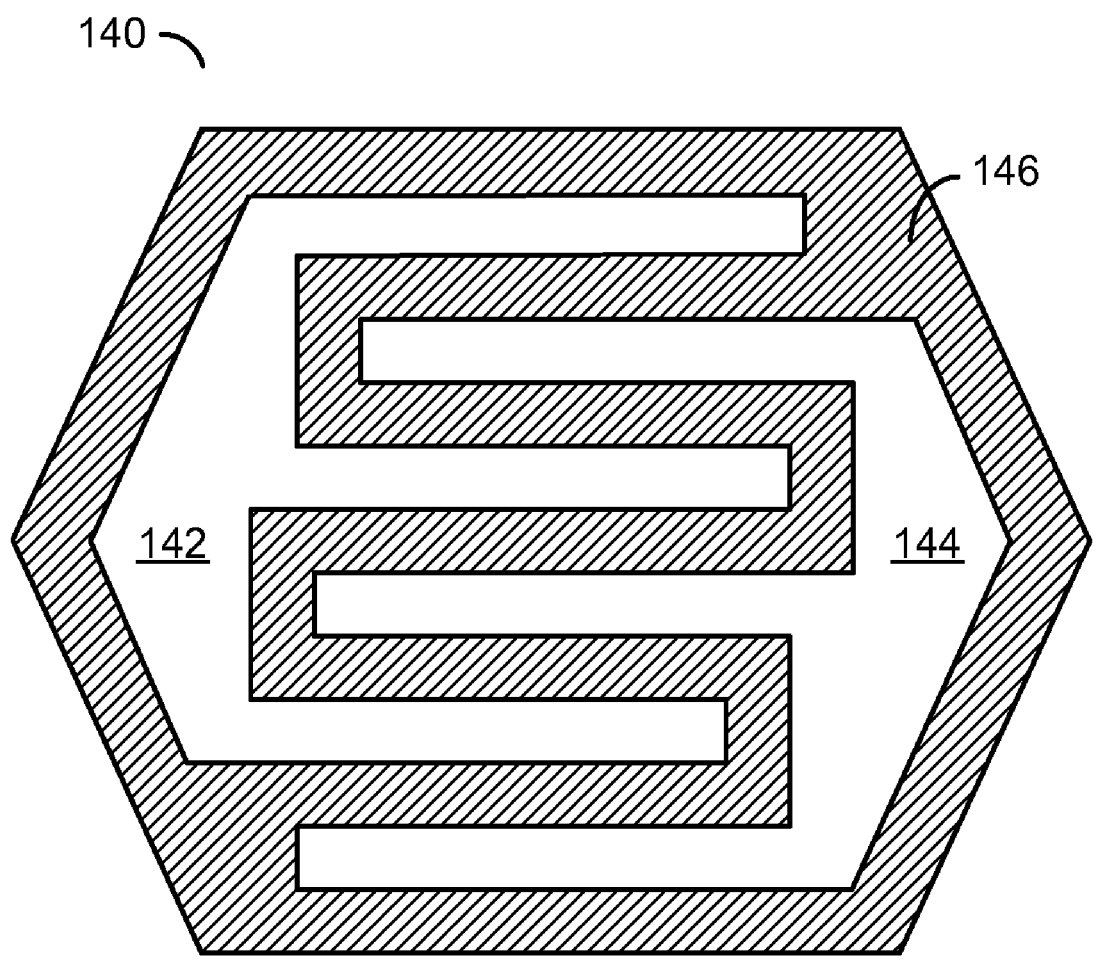
FIG. 4 is a diagram of an example implementation of a pattern within the device.

Referring to FIG. 4, a diagram of an example implementation of a pattern 140 within a device is shown. The pattern (or region) 140 may be used in the pattern 126 (FIG. 3) and/or the pattern 128 (FIG. 3). The pattern 140 generally comprises a first shape (or region) 142 and a second shape (or region). An insulating gap 146 may separate the region 142 and the region 144.

The pattern 140 may be suitable to create portions of both plates of the capacitor 115 of the device 100 and/or the device 120. For example, the shape 142 may be used as part of the first plate while the shape 144 may be used as part of the second plate of the capacitor 115. As illustrated, each of the shapes 142 and 144 has a basic "comb" configuration with interlaced "teeth." Other shapes may be implemented to meet the criteria of a particular application.

Figure 5:
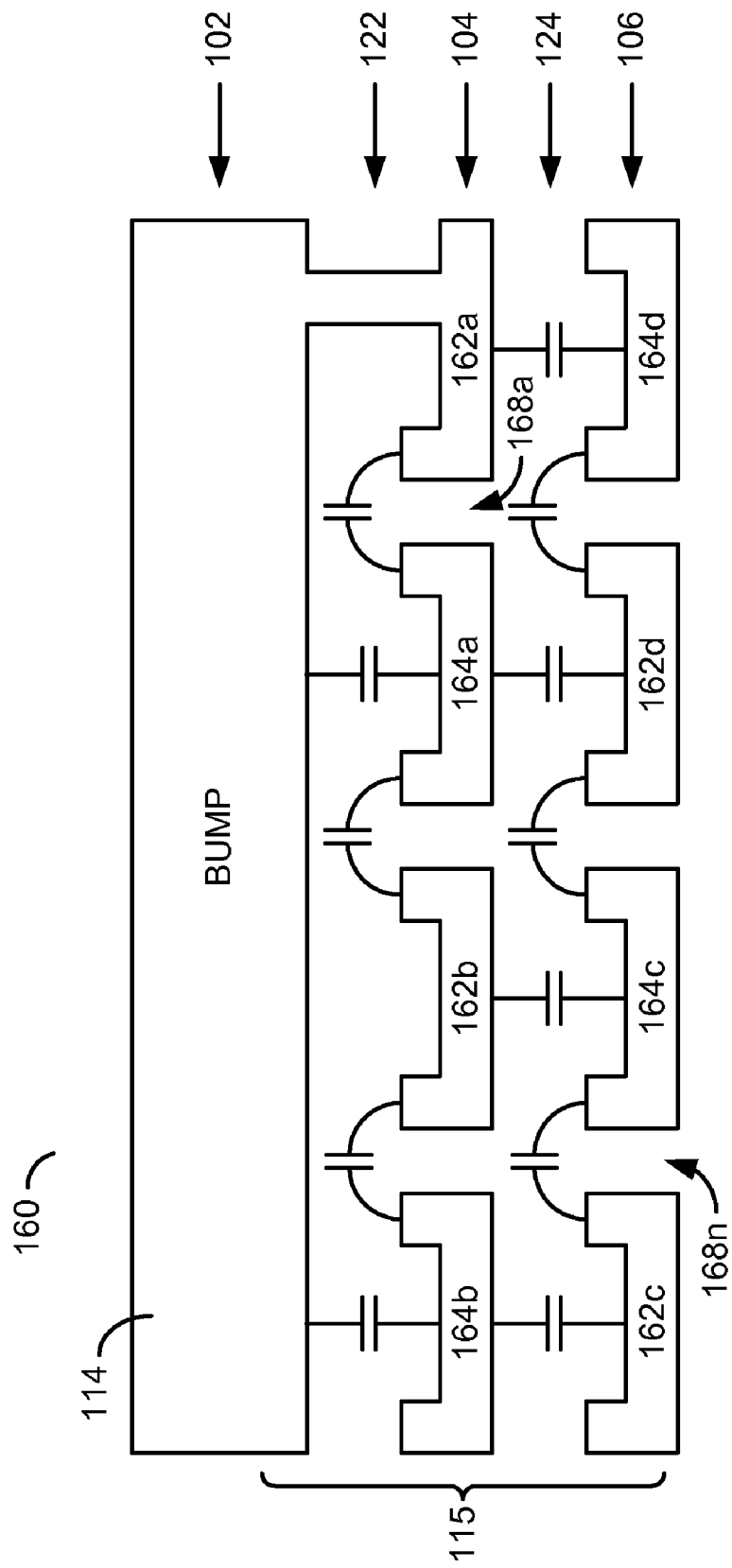
FIG. 5 is a diagram of a third example implementation of the device.

Referring to FIG. 5, a diagram of a third example implementation of a device 160 is shown. The device (or module) 160 may be a variation of the device 100 and/or the device 120. The device 160 generally comprises the bump 114 in the layer 102, the layer 104, the layer 106, the layer 122 and the layer 124. A first set of conductive patterns 162a-162d may be created in the layers 104 and 106. A second set of conductive patterns 164a-164n may be created in the layers 104 and 106. Fences 168a-168n may be formed between the patterns 162a-162d and the patterns 164a-164d.

Connections may be made within and between the layers 104 and 106 to link the patterns 164a-164d together thereby establishing the first plate of the capacitor 115. Additional connections may be made within the between layers 102, 104 and 106 to link the bump 114 and the patterns 162a-162d together thereby establishing the second plate. The patterns 162a-162d and the patterns 164a-164d may be alternated (i) within the layers 104 and 106 to create fringe capacitances and (ii) between the layers 104 and 106 to create parallel-plate capacitances.

The fences and/or other structures may mingle the existence of both plates of the capacitor 115 at some to all of the layers 104-112 (but generally not the layer 102) to increase the unit capacitance. Each of the two capacitor plates at every layer 102-112 is generally connected to itself at other layers 104-112 through metal-to-metal contacts. As a result, both plates of the capacitor 115 may be accessible at the bottom of the hybrid structure.

In the layers 104-112, a length, a width and a shape of the various plate patterns may be dictated by the size and the shape of the bump 114. Different fence spacing may be used to account for layers 104-112 of different thickness. The fence structure may be made of comb shapes or any other shapes.

The capacitor 115 may be made as a single unit or as a collection of multiple units. The exact number of layers 102-112 used in a particular application may be decided by a minimum AC coupling capacitance specification. Larger than specified capacitances may be implemented in an application without departing from the spirit of the present invention.

Figure 6:
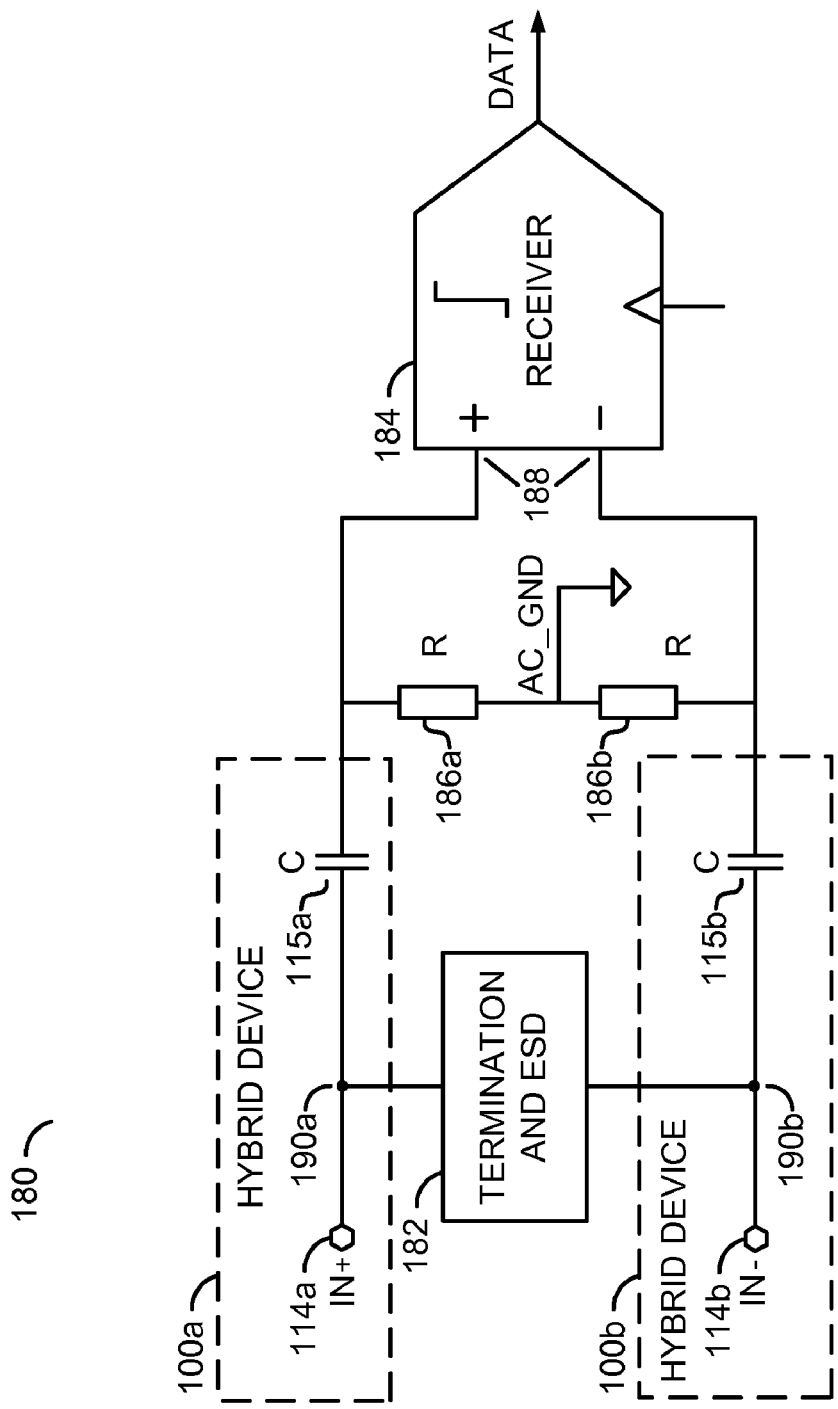
FIG. 6 is a block diagram of a first example implementation of a chip employing the device.

Referring to FIG. 6, a block diagram of a first example implementation of a chip 180 employing the devices is shown. The chip (or device) 180 may implement a high-speed transceiver circuit. The chip 180 generally comprises two devices 100a-100b, a circuit (or module) 182, a circuit (or module) 184 and two resistors 186a-186b. The device 100a may include a bump 114a and a capacitor 115a. The device 100b may include a bump 114b and a capacitor 115b.

A differential input signal (e.g., IN) may be received by the bumps 114a-114b, respectively. The signal IN (e.g., IN+ and IN−) may be coupled through the capacitors 115a-115b to a differential input 188 of the device 184. The device 184 may generate and present a signal (e.g., DATA). The circuit 182 may be coupled from (i) a node 190a between the bump 114a and the capacitor 115a to (ii) a node 190b between the bump 114b and the capacitor 115b. The resistor 186a may be connected from (i) between the capacitor 115a and the circuit 184 to (ii) a ground (e.g., AC_GND). The resistor 186b may be connected from (i) between the capacitor 115b and the circuit 184 to (ii) the ground AC_GND.

The circuit 182 may implement a termination and/or an electrostatic discharge (ESD) circuit. The circuit 182 may be operational to provide proper impedance termination for the signal IN. The circuit 182 may also be operational to provide an electrostatic discharge protection for the chip 180 at the bump/pad interfaces of the devices 100a-100b.

The circuit 184 may implement a differential receiver circuit. The circuit 184 may be operational to generate the signal DATA in response to a voltage difference between each side of the signal IN (e.g., DATA=IN+ minus IN−). Other types of receivers, such as single ended receivers, may be implemented to meet the criteria of a particular application.

The resistors 186a-186b and the capacitors 115a-115b generally have resistances values and capacitance values selected to form RC filters suitable to AC couple the signal IN to the circuit 184. The capacitors 115a-115b generally block any DC component of the signal IN from reaching the circuit 184.

Figure 7:
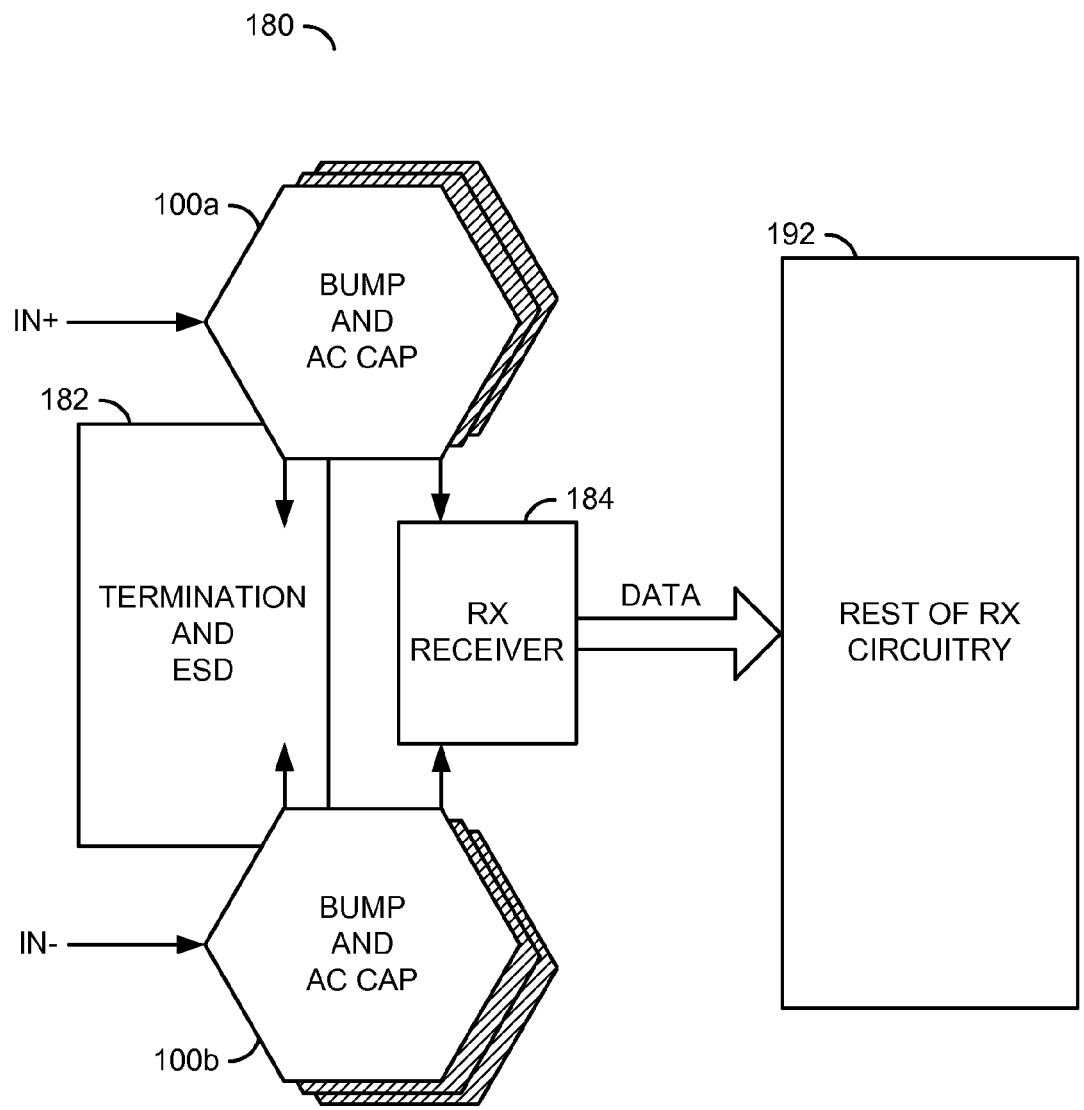
FIG. 7 is top view of the chip shown in FIG. 6.

Referring to FIG. 7, top view of the chip 180 is shown. The devices 100a-100b may be created partially overlapping the circuit 182 and/or the circuit 184. The overlap may permit short, low parasitic conduction paths from the devices 100a-100b to the circuits 182-184. An additional circuit 192 is shown as a destination of the signal DATA.

Figure 8:
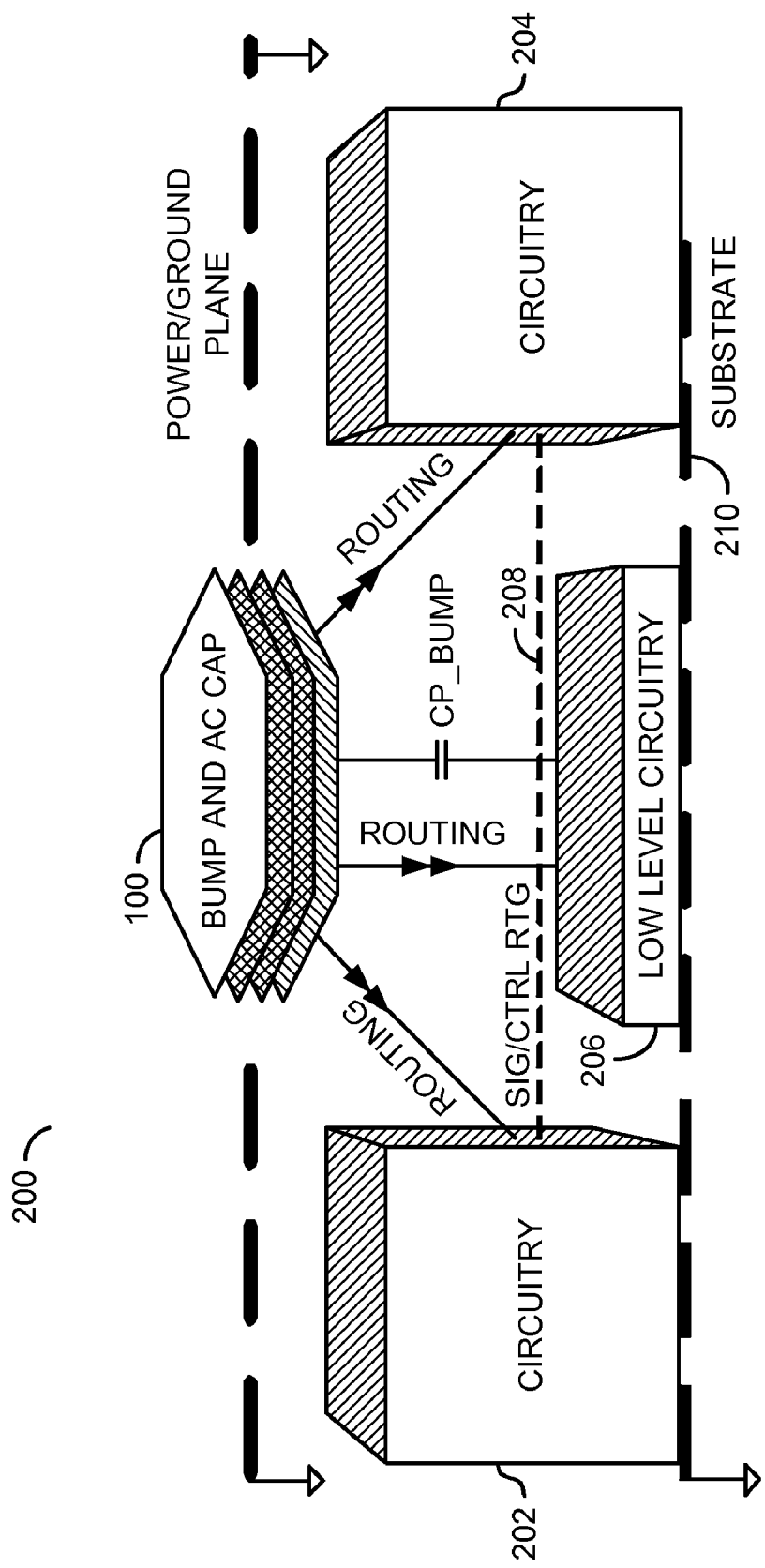
FIG. 8 is a perspective view of a second example implementation of a chip incorporating the device.

Referring to FIG. 8, a perspective view of a second example implementation of a chip 200 incorporating the devices is shown. The chip (or device) 200 may provide an AC coupling scheme to external circuitry through the bump 114. The chip 200 generally comprises the device 100 (including the bump 114 and the capacitor 115), a circuit (or module) 202, a circuit (or module) 204 and a circuit (or module) 206. The circuit 202 is generally fabricated in and/or on a substrate 210 and positioned to one side of the device 100. The circuit 204 may be fabricated in and/or on the substrate 210 and positioned to another side of the device 100 (e.g., opposite from the circuit 202). The circuit 206 may be fabricated in and/or on the substrate 210 and positioned under the device 100. One or more conductive traces 208 may be routed between the circuit 202 and the circuit 204 passing between the circuit 206 and the device 100.

In the arrangement shown in FIG. 8, a surface area occupied by the device 100 is essentially "free" and may not consume a unique silicon footprint. Since the device 100 is made of high-level metals (e.g., at least metal layer 2 or above), the device 100 may be fabricated above other active or passive circuits (e.g., circuit 206) without allocating a separate silicon budget to the device 100.

The close position of the device 100 relative to the circuits 202, 204 and 206 generally results in short routings of signals between the device 100 and the circuits 202, 204 and/or 206. For example, the circuit 206 may be connected to one or both of the capacitor plates of the device 100 through inter-layer channels.

Figure 1:
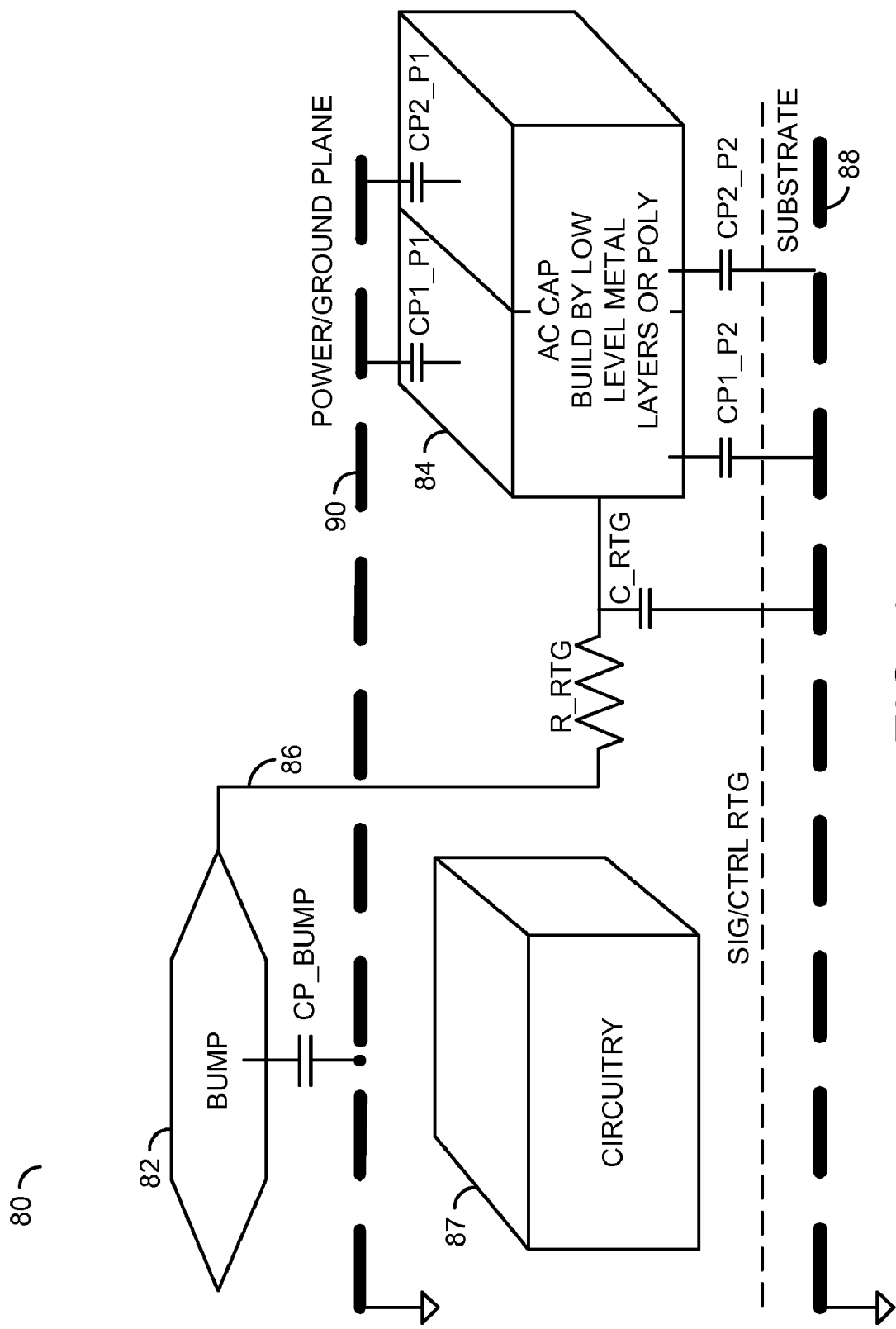
FIG. 1 is a perspective diagram of a conventional on-chip AC-coupled high speed circuit.

The arrangement of the device 100 generally provides better parasitic capacitance performance compared with existing techniques. When compared with the bump 82 and the capacitor 84 arrangement shown in FIG. 1, the device 100 may (i) reduce the parasitic capacitance CP_BUMP formed to the power/ground plane 90 or the substrate 88, (ii) significantly reduce or eliminate the large parasitic capacitances CP1_P1 and CP2_P1 and (iii) eliminate the parasitic routing resistance R_RTG and the routing parasitic capacitance C_RTG. Furthermore, the signal routings between the device 100 and each of the circuits 202, 204 and 206 may be shorter and easier.

As stated earlier, both plates of the capacitor 115 in the device 100 may be accessed from the bottom. Since a horizontal size of the device 100 may be relatively large and the capacitor 115 may be made of many units of mini-capacitors bundled together, the signals at both ends of the capacitor 115 may be delivered over a wide projected area and readily reachable to the circuits 202, 204 and/or 206 from below and/or close proximity. Instead of paying a performance price for the routing parasitics when distributing the signal received by the bump 82 to the capacitor 84, the routings inside the device 100 that connect the mini-capacitors generally contributes to the capacitance used for AC coupling purposes. Another benefit of using the device 100 may be that because the capacitor 115 has been created away from the lower layer metals, a difficulty that normally results from the metal path blockage may be eliminated and the crossover signal routing along the traces 208 between the circuit 202 and the circuit 208 may be easy.

Figure 9:
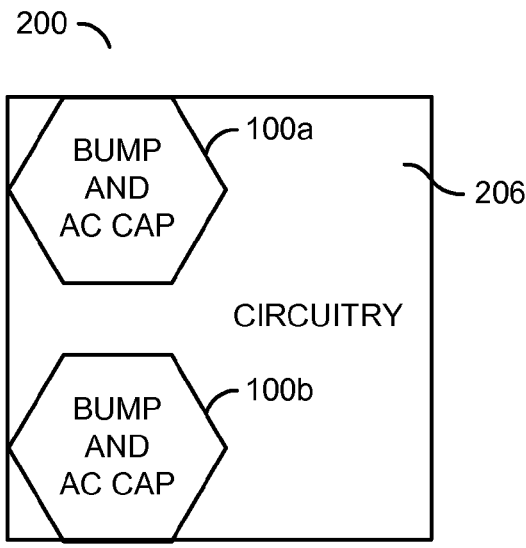
FIG. 9 is a top view of the chip shown in FIG. 8.

Referring to FIG. 9, a top view of the chip 200 is shown. The device 100 is generally illustrated having two devices 100a-100b. As shown, the device 100a-100b may be created directly above the circuit 206. Therefore, the silicon footprint of the devices 100a-100b are essentially free.

Figure 10:
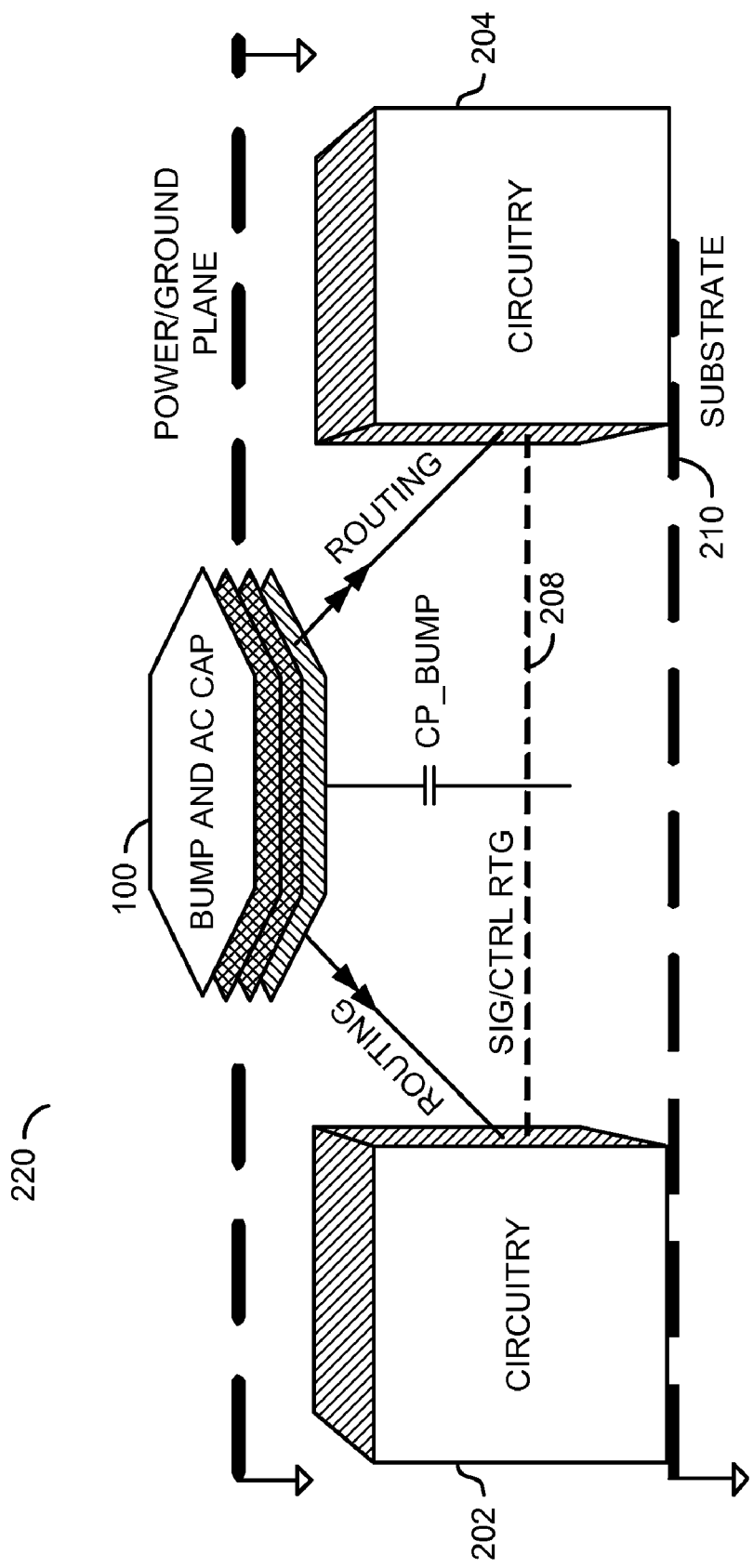
FIG. 10 is a perspective view of a third example implementation of a chip incorporating the device.

Referring to FIG. 10, a perspective view of a third example implementation of a chip 220 incorporating the devices is shown. The chip (or device) 220 may be a variation of the chip 200. The chip 220 generally comprises the device 100, the circuit 202, the circuit 204 and the one or more traces 208 fabricated in and/or on the substrate 210. In the chip 220, the circuit 206 under the device 100 may be removed to reduce the parasitic capacitance CP_BUMP further. The setup shown is generally useful for ultra high-speed applications (e.g., 10 Gbps) and above.

Figure 11:
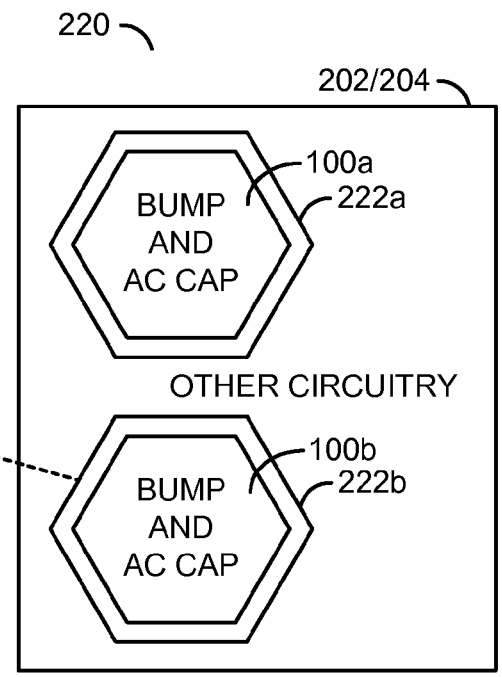
FIG. 11 is a top view of the chip shown in FIG. 10.

Referring to FIG. 11, a top view of the chip 220 is shown. The device 100 is generally illustrated as two devices 100a-100b. Each of the devices 100a-100b may be enclosed in a respective "no fly zone" 222a-222b. Each of the zones 222a-222b generally defines a region (or pattern) around the associated device 100a-100b in which no other circuitry may be placed in the design.

As may be understood by one of ordinary skill in the art, the present invention may be embodied in other specific forms to meet the criteria of a particular application. For example, the device 100 may be implemented in, but is not limited to, CMOS, bipolar and other technologies. The device 100 may also be used for either flip chip packaging or wire-bond package. The bump 114 may be used as either an input pin, an output pin or a bidirectional pin. Furthermore, the detail conformations, such as but not limited to, the shape and/or size of the bump 114 and metal layer usage may be customized without departing from the spirit of the invention. The device 100 generally enables implementation of on-chip AC coupling capacitors having sufficient capacitances to pass 10 Gbps signals without a loss performance. A chip incorporating the device 100 was implemented in a standard 65 nanometer CMOS technology. Measured results confirmed a 5.2 picofarad (pF) AC coupling capacitance, a 40 femtofarad (fF) total parasitic capacitance and proper operation of the device 100.

The function performed by the diagrams of FIGS. 2-11 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMS, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the scope of the invention.

The invention claimed is:

1. A device comprising:
   a first pattern and a second pattern both created in an intermediate conductive layer of a chip, wherein said first pattern establishes a first of a plurality of plates of a first capacitor;
   at least one via created in an insulating layer above said intermediate conductive layer, wherein said via is aligned with said second pattern; and
   a first bump created in a top conductive layer above said insulating layer, wherein (A) said first bump (i) is located directly above said first plate, (ii) establishes a second of said plates of said first capacitor, (iii) is suitable for flip-chip bonding and (iv) connects to said second pattern through said via such that both of said plates of said first capacitor are accessible in said intermediate conductive layer and (B) said first pattern and said second pattern are shaped as interlocking combs.

2. The device according to claim 1, wherein said first pattern and said second pattern are isolated from each other by at least one fence structure.

3. The device according to claim 1, further comprising a circuit located under said first bump and connected to said first plate such that said circuit is AC coupled to said first bump.

4. The device according to claim 1, further comprising a first circuit proximate a first side of said first bump and connected to said first plate such that said first circuit is AC coupled to said first bump.

5. The device according to claim 4, wherein said first circuit comprises a high-speed signal receiver circuit.

6. The device according to claim 5, further comprising a second circuit proximate a second side of said first bump, wherein said second side is opposite said first side.

7. The device according to claim 6, wherein said second circuit comprises a high-speed signal termination circuit.

8. The device according to claim 6, wherein said second circuit is connected to said second plate such that said second circuit is DC coupled to said first bump.

9. The device according to claim 6, further comprising a signal trace created in a lower conductive layer below said intermediate conductive layer, said signal trace (i) passing under said first bump and (ii) connecting said first circuit to said second circuit.

10. The device according to claim 4, further comprising a second bump proximate said first circuit, wherein said second bump forms a second capacitor coupled to said first circuit.

11. The device according to claim 1, further comprising a volume between said first plate and a substrate of said chip, wherein no other circuitry is located in said volume to minimize a parasitic capacitance of said first bump.

12. A method of fabricating a device on a chip, comprising the steps of:
   (A) creating both a first pattern and a second pattern in an intermediate conductive layer of said chip, wherein said first pattern establishes a first of a plurality of plates of a first capacitor;
   (B) creating at least one via in an insulating layer above said intermediate conductive layer, wherein said via is aligned with said second pattern; and
   (C) creating a first bump in a top conductive layer above said insulating layer, wherein said (A) first bump (i) is located directly above said first plate, (ii) establishes a second of said plates of said first capacitor, (iii) is suitable for flip-chip bonding and (iv) connects to said second pattern through said via such that both of said plates of said first capacitor are accessible in said intermediate conductive layer and (B) said first pattern and said second pattern are shaped as interlocking combs.

13. The method according to claim 12, further comprising the step of:
   creating both a third pattern and a fourth pattern in a lower conductive layer below said intermediate conductive layer, wherein (i) said third pattern is located under said first bump and establishes part of said first plate and (ii) said fourth pattern is connected to said second plate such that both of said plates of said first capacitor are accessible in said lower conductive layer.

14. The method according to claim 12, further comprising the step of:
   creating a first signal trace in said intermediate conductive layer between said first plate and a first circuit such that said first bump is AC coupled to said first circuit.

15. The method according to claim 14, further comprising the step of:
   creating a second signal trace in said intermediate conductive layer between said second plate and a second circuit such that said first bump is DC couple to said second circuit.

16. The method according to claim 14, further comprising the step of:
   creating a second bump proximate said first circuit, wherein said second bump forms a second capacitor coupled to said first circuit.

17. The method according to claim 12, further comprising the step of:
   creating a signal trace in a lower conductive layer below said intermediate conductive layer such that said signal trace passes under said first bump.

\* \* \* \* \*